United States Patent
Glenn et al.

(10) Patent No.: US 11,727,633 B2
(45) Date of Patent: Aug. 15, 2023

(54) THREE DIMENSIONAL STRUCTURAL PLACEMENT REPRESENTATION SYSTEM

(71) Applicant: Plant Prefab, Inc., Rialto, CA (US)

(72) Inventors: Steve Glenn, Rialto, CA (US); Matt Langton, Rialto, CA (US); Kranti Deshmukh, Rialto, CA (US); Deep Bhattacharya, Rialto, CA (US); Nick Giancola, Rialto, CA (US)

(73) Assignee: Plant Prefab, Inc., Rialto, CA (US)

( * ) Notice: Subject to any disclaimer, the term of this patent is extended or adjusted under 35 U.S.C. 154(b) by 33 days.

(21) Appl. No.: 16/998,460

(22) Filed: Aug. 20, 2020

(65) Prior Publication Data

US 2022/0058862 A1 Feb. 24, 2022

(51) Int. Cl.
*G06T 17/05* (2011.01)
*G06F 30/13* (2020.01)
(Continued)

(52) U.S. Cl.
CPC .............. *G06T 17/05* (2013.01); *G06F 30/13* (2020.01); *G06T 15/10* (2013.01); *G06T 17/10* (2013.01)

(58) Field of Classification Search
CPC ......... G06T 17/05; G06T 15/10; G06T 17/10; G06F 30/13
See application file for complete search history.

(56) References Cited

U.S. PATENT DOCUMENTS

| 10,817,155 | B1 * | 10/2020 | Dubov .................. | B29C 64/393 |
| 2012/0274625 | A1 | 11/2012 | Lynch | |
| 2013/0132041 | A1 * | 5/2013 | Sigaty .................. | G06T 15/005 703/1 |

(Continued)

FOREIGN PATENT DOCUMENTS

| JP | 2001216355 A | * | 8/2001 |
| JP | 2002109019 A | * | 4/2002 |

(Continued)

OTHER PUBLICATIONS https://isicad.ru/ru/articles.php?article_num=20657, Jul. 11, 2019 (English translation provided).

(Continued)

*Primary Examiner* — King Y Poon
*Assistant Examiner* — Vincent Peren
(74) *Attorney, Agent, or Firm* — Smyrski Law Group, A P.C.

(57) ABSTRACT

A system for providing a 3D representation of a desired structure on a selected property. A processing arrangement receives a property indication of the selected property. At least one converter converts the property indication to a format representing a 3D graphical representation of the selected property. A mapper maps the selected property to a largest available polygon that will fit on the selected property. The system determines a resultant polygon from the largest available polygon based on local restrictions for the selected property. A user selects the desired structure from available structures and orients the desired structure on the resultant polygon at a permissible orientation. A renderer renders the desired structure on the selected property in 3D graphical form. As a result, users can observe the house at different angles around the property, configure the structure with desired external design features, and view the result on the selected property.

20 Claims, 6 Drawing Sheets

(51) Int. Cl.
*G06T 15/10* (2011.01)
*G06T 17/10* (2006.01)

(56) References Cited

U.S. PATENT DOCUMENTS

| | | | |
|---|---|---|---|
| 2013/0132440 | A1 | 5/2013 | Carlson et al. |
| 2015/0154318 | A1* | 6/2015 | Detwiler ............... G06Q 50/08 703/1 |
| 2016/0110824 | A1* | 4/2016 | Zabala Rodriguez ....................... G06Q 50/165 705/315 |
| 2017/0329875 | A1* | 11/2017 | Detwiler ............... G06Q 10/06 |
| 2018/0204153 | A1* | 7/2018 | Chiang ............. G06Q 10/0631 |
| 2019/0213286 | A1* | 7/2019 | Bauer ................... G06F 3/0486 |
| 2020/0387138 | A1* | 12/2020 | Dubov ............ G05B 19/40931 |
| 2021/0191364 | A1* | 6/2021 | Dubov ................ G06F 3/04815 |

FOREIGN PATENT DOCUMENTS

| | | | | |
|---|---|---|---|---|
| JP | 2008248695 | A | * 10/2008 | |
| JP | 2018026016 | A | * 2/2018 | |
| JP | 2018136697 | A | * 8/2018 | |
| JP | 2018136914 | A | * 8/2018 | |
| JP | 2018195340 | A | * 12/2018 | ............. G06Q 50/08 |
| JP | 2020009480 | A | * 1/2020 | ............. G06Q 50/08 |
| KR | 20210097307 | A | * 8/2021 | |
| WO | WO-2012057841 | A2 | * 5/2012 | ............. G06F 30/13 |
| WO | WO-2019144200 | A1 | * 8/2019 | ............. G06Q 10/10 |

OTHER PUBLICATIONS https://sapr.ru/article/24521, Jun. 2014 (English translation provided).

* cited by examiner

THREE DIMENSIONAL STRUCTURAL PLACEMENT REPRESENTATION SYSTEM

BACKGROUND OF THE INVENTION

Field of the Invention

The present invention relates generally to the field of real property evaluation systems, and more specifically to computational systems used to provide 2D and 3D representations of proposed structures on existing properties in real time.

Description of the Related Art

Individuals interested in real estate frequently wish to either build on existing land or tear down or partially tear down existing structures and build new structures on pieces of property. Up to this point, those interested in purchasing and placing a new structure on a piece of property would need to contact an architect or other qualified individual to prepare a set of drawings reflecting how a new structure would look on a piece of land. Such drawings can take extensive amounts of time to prepare. First, architects must review the zoning information that applies to a specific property in order to understand the constraints that would dictate the size and nature of any development on the property. Additionally, individuals may have a general idea of a desired structure, but once drawings are prepared, may change their minds and desire a different structure, with different dimensions, requiring revisions to drawings, which can be costly and take even more time.

Up to this point, abilities to consider different structures on established properties have been limited, and many take hours or days to complete and provide. Any desired changes require further time and effort to complete. Additionally, systems are available that offer simple two dimensional representations of desired structures on generic properties or flat spaces, which do not account for particular issues with specific plots of land and the challenges with locating structures thereon. As a result, users are forced to imagine what a structure would look like on a specific piece of property.

It would therefore be advantageous to provide a system that overcomes the issues and limitations of current devices and arrangements used to display potential structures on real estate without the need to wait for extensive periods of time.

SUMMARY OF THE INVENTION

A system for providing a three-dimensional representation of a desired structure on a selected property is presented. The system includes a processing arrangement configured to receive a property indication of the selected property, at least one converter that converts the property indication to a standardized three dimensional visual format representing a three dimensional graphical representation of the selected property, a mapper that maps the selected property to a largest available polygon that will fit on the selected property, a zoning setback computation element that determines a resultant polygon from the largest available polygon based on local governmental zoning restrictions for the selected property, location hardware enabling a user to select the desired structure, the desired structure selectable from one of a plurality of available structures, and orient the desired structure on the resultant polygon at an available and permissible orientation, and a renderer that renders the desired structure on the selected property in three dimensional graphical form, thereby producing the three dimensional representation.

According to a further embodiment, there is provided a method for providing a three-dimensional representation of a desired structure on a selected property. The method comprises receiving at a computing arrangement a property indication of the selected property transmitted by a remote computing device in a first form, at the computing arrangement, converting the property indication from a first form to a second form and establishing a graphical three dimensional representation of represent, at the computing arrangement, plotting the second form of the property indication on a map and identifying a largest polygon available that fits on the selected property, at the computing arrangement, receiving governmental property restriction information and applying the governmental property restriction information to the largest polygon available to determine a resultant polygon, at the computing arrangement, locating the desired structure in a desired orientation within the resultant polygon, at the computing arrangement, establishing the three dimensional representation of the desired structure on the selected property, and transmitting the three dimensional representation of the desired structure on the selected property from the computing arrangement to the remote computing device.

According to a further embodiment, there is provided a system for providing a three-dimensional representation of a desired structure on a selected property, comprising a transmission element configured to transmit a property indication in a first form, and a central processing arrangement comprising at least one computing device. The computing device is configured to receive an indication from a user of the desired structure, develop a three dimensional representation of the selected property based on available information about the selected property, convert the property indication from a first form to a second form, plot the second form of the property indication on a map and identify a largest polygon available that fits on the selected property, receive governmental property restriction information and apply available governmental property restriction information to the largest polygon available to establish a resultant polygon, locate the desired structure in a desired orientation within the resultant polygon, and determine a three dimensional graphical representation of the desired structure scaled to fit the resultant polygon and graphically located on the three dimensional representation of the selected property. The central processing arrangement is further configured to transmit the three-dimensional graphical representation of the desired structure on the selected property to the transmission element.

These and other advantages of the present invention will become apparent to those skilled in the art from the following detailed description of the invention and the accompanying drawings.

BRIEF DESCRIPTION OF THE DRAWINGS

For a more complete understanding of the present disclosure, reference is now made to the following figures, wherein like reference numbers refer to similar items throughout the figures.

DETAILED DESCRIPTION

The following description and the drawings illustrate specific embodiments sufficiently to enable those skilled in the art to practice the system and method described. Other embodiments may incorporate structural, logical, process and other changes. Examples merely typify possible variations. Individual elements and functions are generally optional unless explicitly required, and the sequence of operations may vary. Portions and features of some embodiments may be included in, or substituted for, those of others.

The present design provides a real time system that establishes boundaries and attributes of real estate, such as a piece of property, based on existing records, receives attributes of a structure to be located on the property, determines limitations and requirements for the location of the structure on the property, receives desired attributes of the structure on the property, determines the dimensions and overall appearance of the structure on the property based on received criteria, and provides a visual representation of the property, in a desired form, to a user. The process or procedure for determining the appearance of the structure is particularly novel, and the system provides proposed structure representations in seconds or in essentially real time. Further, the system may receive changes to certain attributes and may perform further processing of the received changes and determine a different structure. For example, a certain size and dimension house may be represented on multiple candidate properties, or appearance of a structural change, such as a second garage or an additional room, may be determined and represented using the system.

Figure 1:
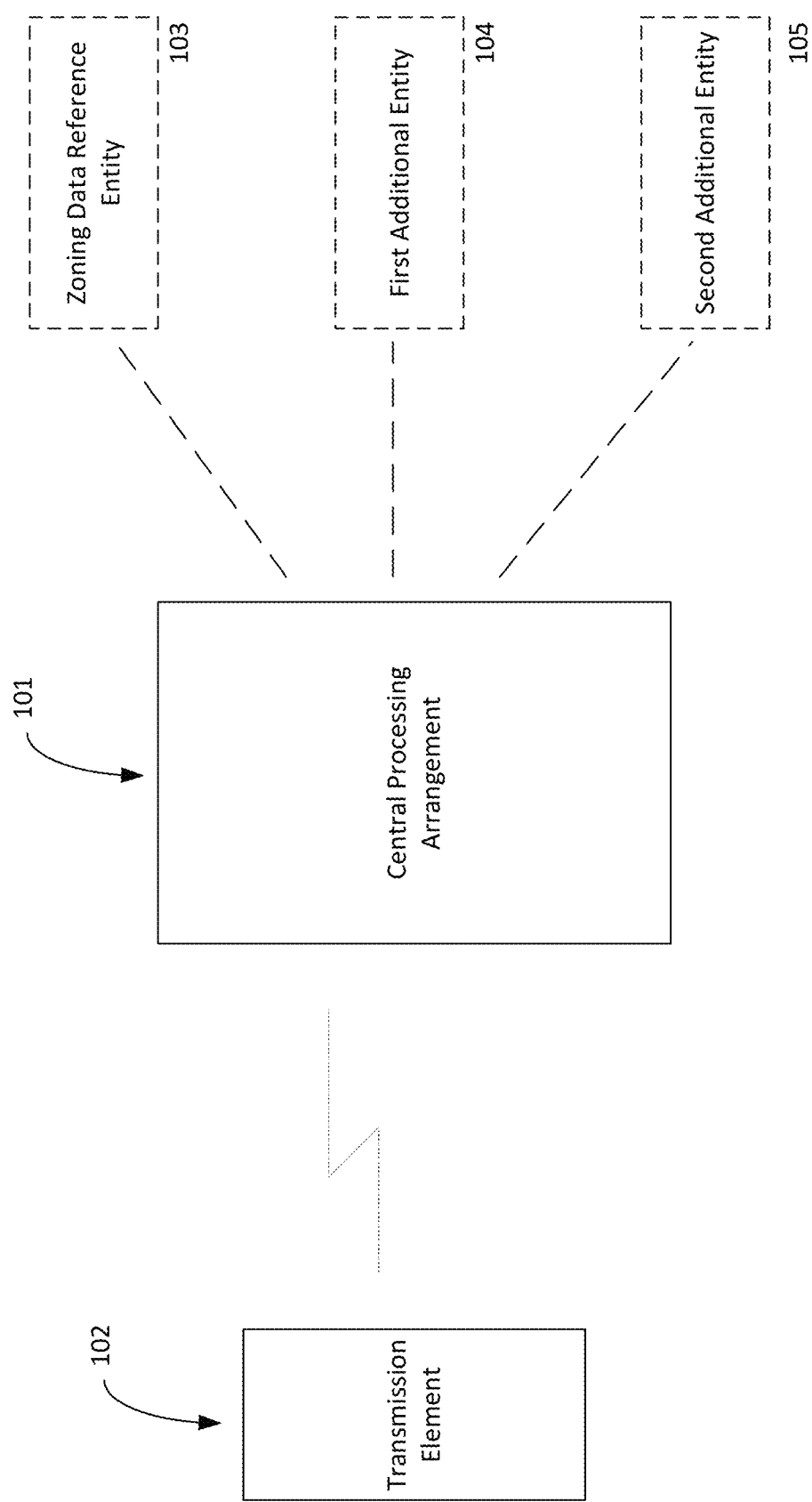
FIG. 1 illustrates the components of the overall system.

FIG. 1 illustrates the overall system. From FIG. 1, there is provided a central processing arrangement 101 that may include a single server or computing device or an array of servers or computing devices, for example. Transmission element 102 provides a request or a series of requests for a particular structure or a particular piece of property, or multiple structures or properties. A user may be associated with transmission element 102, for example, and transmission element 102 may be a personal computing device or smartphone, for example. One or more pieces of information may be transmitted from transmission element 102 to central processing arrangement 101, from a simple indication of an address of a piece of property and a known structure design, such as "Structure 412a" and "314 Houser Street, Baltimore, Md." However, more information may also be provided about the structure desired and/or the property in question. For example, a list of desired rooms, a floor plan, components of a modular structure, or other information may be provided, and property attributes, such as "place the north wall no more than 20.5 feet from the adjacent street" or other restrictions may be provided. Certain translation may be provided by the central processing arrangement as discussed herein. The central processing element, as a result of receiving the information, may seek more information by transmitting to queries to transmission element 102. For example, if the property is unknown due to an error, the central processing unit 101 may transmit an error message or indication or a request for more information to transmission element 102. Alternately, if there is no piece of property having the provided address, or if the central processing unit receives a structure request that cannot fit on the identified property, error processing may request more or corrected information via transmission to transmission element 102.

Also in FIG. 1 are reference sources or entities, which may be databases, server arrangements, or other electronically accessible storage components or storage entities, including in this view zoning data reference entity 103, with other possible sources of information shown as first additional entity 104 and second additional entity 105. While connections between elements are shown as dotted lines in FIG. 1, it is understood connections may be wired, wireless, or a combination of both as desired. Further, the absence of connections between elements is immaterial, as for example the entities may be interconnected or may form part of or otherwise be associated with central processing unit 101. Thus the entities 103-105 in FIG. 1 may be part of one server arrangement, multiple server arrangements, or part of central processing unit 101 if desired, and are shown as optional in this view. More or fewer information sources or entities may be provided. By way of example and not limitation, first additional entity may be a resource reference, for example a lumber entity that can provide the requisite amount of lumber needed and the cost of such lumber for determining a construction cost of a desired or selected structure. Additionally, an example information source may a modular home material database, providing information such as dimensions of a bathroom, hallway, kitchen, bedroom, etc. available for inclusion in a structure, as well as restrictions or limitations. For example, modular unit C will not fit with modular unit K7. Such information sources may provide restrictions or limitations to central processing unit 101 or may provide information usable to create a representation of the structure or provide information such as anticipated cost or other desired data or information.

Figure 2:
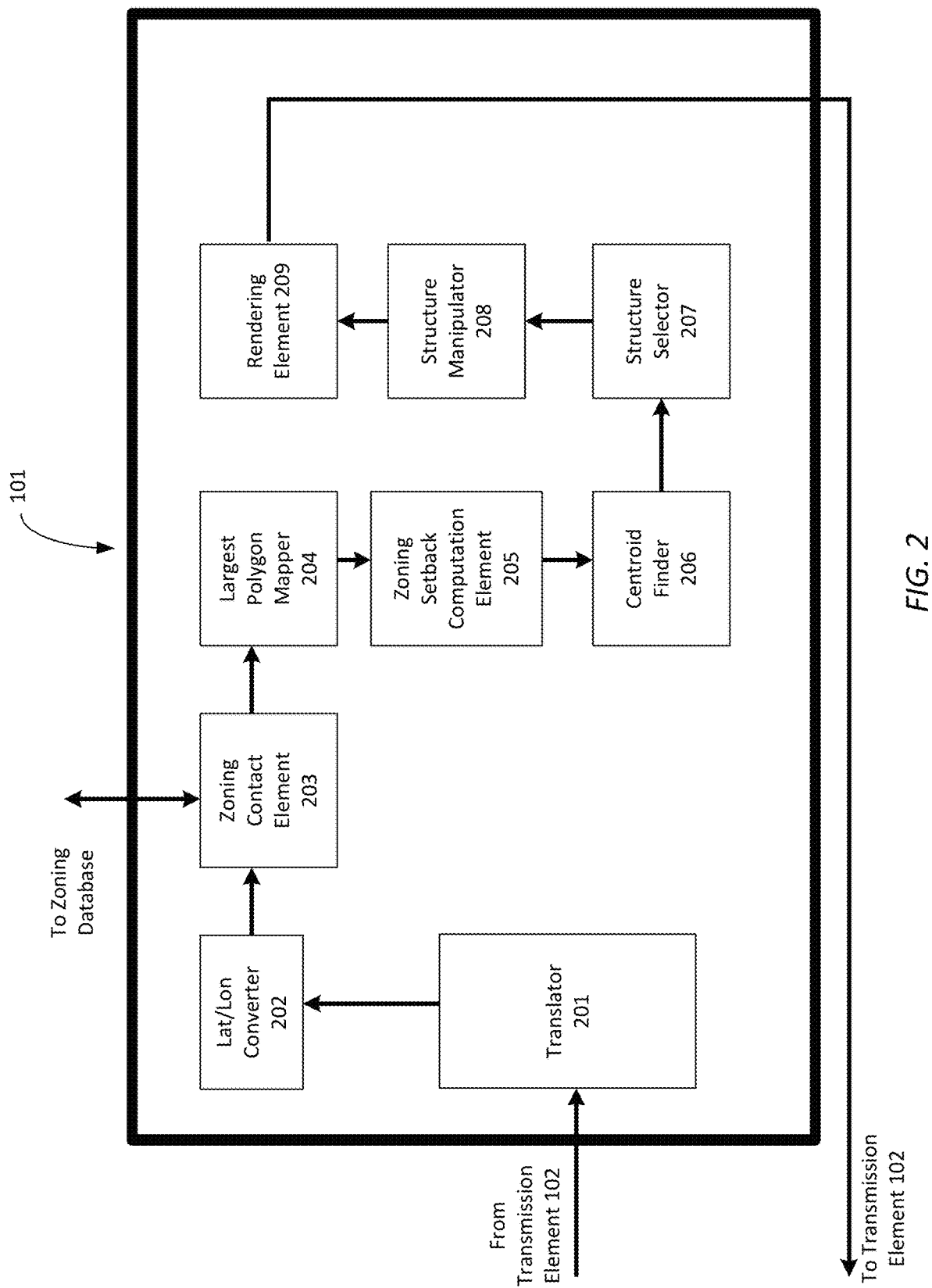
FIG. 2 shows components of the central processing arrangement.

FIG. 2 illustrates one embodiment of major components employed in central processing unit 101. From FIG. 2, translator 201 is provided, and translator 201 translates received data into usable information. In one example, a mistyped address may be corrected, such as "Evns Road" to "Evans Road." Alternately, translator 201 may seek from external sources information, such as known addresses conforming to a standard. Someone entering "25 Peachtree Lane, Atlanta, Georgia" may be prompted with the appropriate 5 or 9 digit zip code using translator 201. Further, the desired structure may employ attributes of translator 201, such as providing corrected dimensions of desired rooms, desired attributes, and so forth. However, the user may be prompted with a fixed set of options such that minimal or no translation is needed from translator 201. After translation, the system may employ Lat/Lon converter 202, which may convert an address to an alternate set of coordinates, such as latitude and longitude coordinates or possibly GPS coordinates, or even X-Y coordinates. Based on the address and coordinates, the system may employ zoning contact element 203 to obtain zoning information about the plot in question, including availability and any other relevant and/or desirable information. Zoning contact element may contact remote hardware and databases or the information may be locally maintained. Zoning information may be saved or stored and referenced when available.

Largest polygon mapper 204 receives available zoning information and may map the site of interest into a polygon, taking into account attributes such as a property boundary and any contours, such as hillsides or other shape differentials of the property, wherein such attributes therefore include topographical contour depth differentials. Largest polygon mapper 204 maps the largest polygon available based on the property information, i.e. the largest space where a structure or structures can be built. Together with zoning setback computation element 205, boundaries may be drawn to known property lines and features may be accounted for wherein buildable structures are infeasible, such as sidewalks, hillsides, and so forth. Largest polygon mapper 204 provides a resultant polygon representing buildable property, and may account for alterable gradations in the land, i.e. buildable space is available if a section of the property does not rise more than three percent. Largest polygon mapper 204 and zoning setback computation element 205 may determine orientation of the constructed property polygon, such as street sides, front versus side, and so forth. Zoning setback computation element 205 may compute zoning setback rules applicable to the polygon constructed by largest polygon mapper 204, resulting in a resultant polygon or revised polygon representing the lot or property after accounting for known zoning setbacks.

Centroid finder 206 finds the centroid of the revised polygon. Structure selector 207 offers a number of available structures and may enable the user to select structural attributes. Users may select particular rooms or particular arrangements of rooms, or a series of standard structures may be offered. Each available structure should in most if not all cases fit on or in the revised polygon. Structure manipulator 208 may reposition the structure to fit in a preferred or desired orientation within the revised polygon. As many be appreciated, the centroid of a structure may not coincide with the centroid of a given polygon, particularly in the case of an oddly shaped resultant polygon. Structure manipulator 208 may rotate or otherwise reposition the structure to fit within the polygon, to leave space for back and side yards, or to fit as close to boundary lines as possible if desired.

If the user wishes to place an additional structure, such as a guest house on the property, attributes may be determined (e.g. separation between the main house and the guest house, placement of the guest house within the polygon, etc.) by the system or by the user if desired.

The system may then determine and provide a two-dimensional representation of the structure on the plot of land using rendering element 209. Such a representation may be obtained from publicly available sources, including online sources (Google Maps, etc.) and other online mapping services. Rendering element 209 may use photographic data for the plot of land or may make graphical representations of the plot of land, possibly including the original polygon or the reduced polygon, and the rendering may be two dimensional.

The system may account for a desire to maintain all or part of an existing structure on a property and may enable determination and rendering of additional parts of the structure to be partially retained, or determination and rendering of the added structure, and a two-dimensional representation may be provided.

Figure 3:
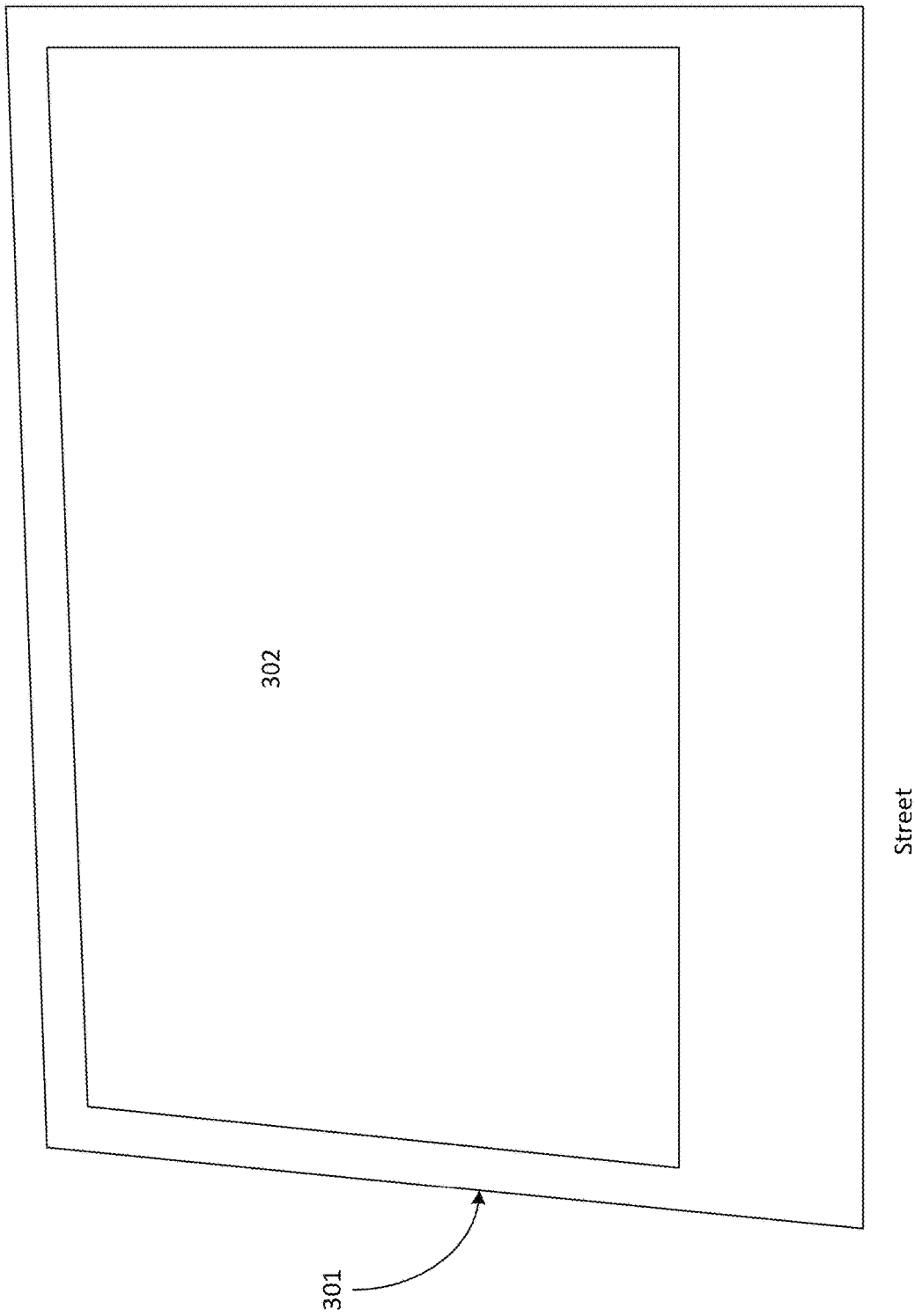
FIG. 3 is a representation of examples of polygons provided according to the present design.
Figure 4:
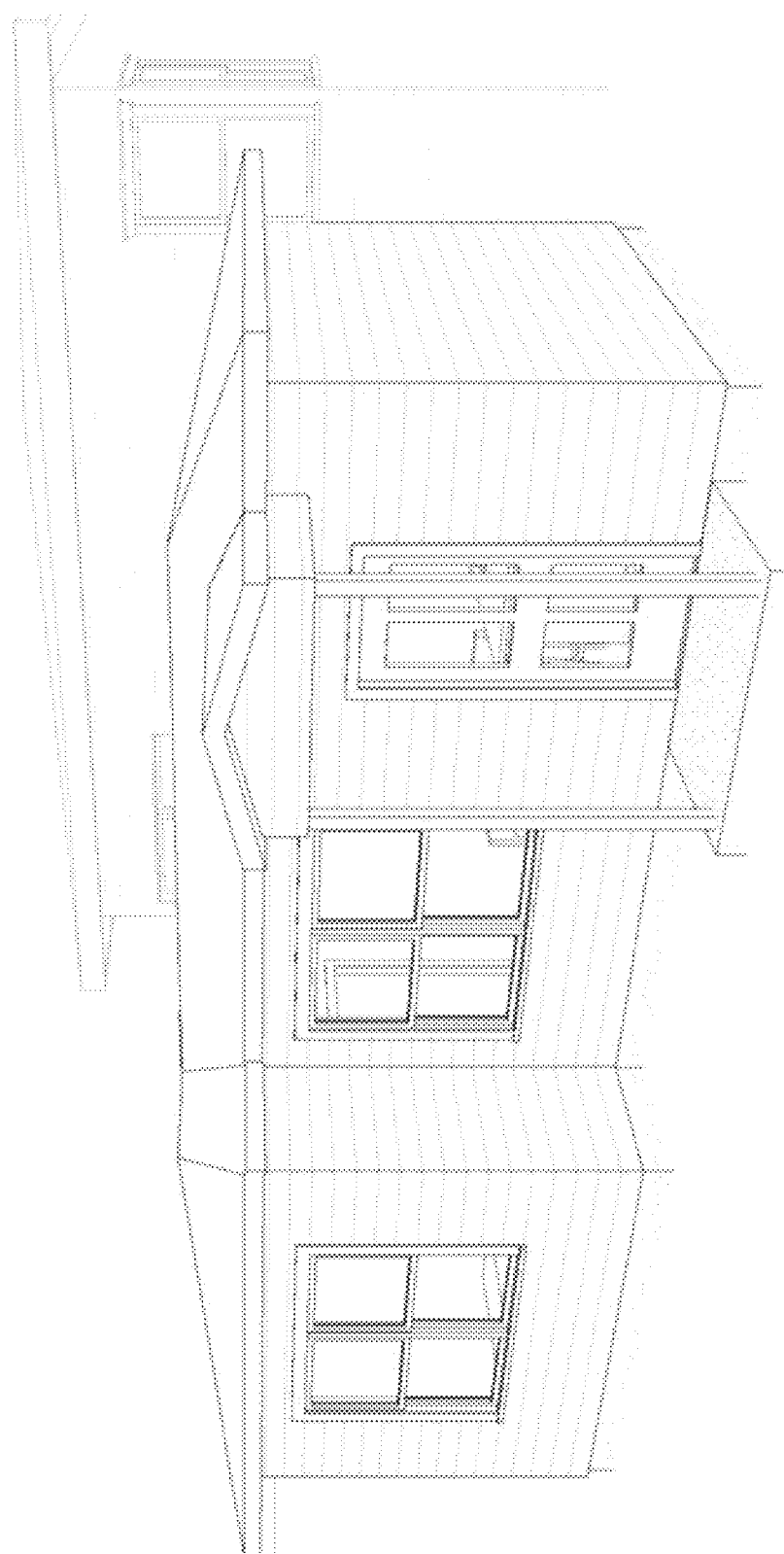
FIG. 4 is a structural representation.

FIG. 3 shows a representative polygon 301, also known as a largest polygon available, and a representative revised polygon 302, also called a resultant polygon, determined in accordance with the present design. FIG. 4 illustrates a representative two-dimensional structure representation that may be provided to the user, visually shown or represented on the desired property. A photograph or other representation of the property may be provided, and the system may provide simple line representations or existing photographic representations of the property in question.

Figure 5:
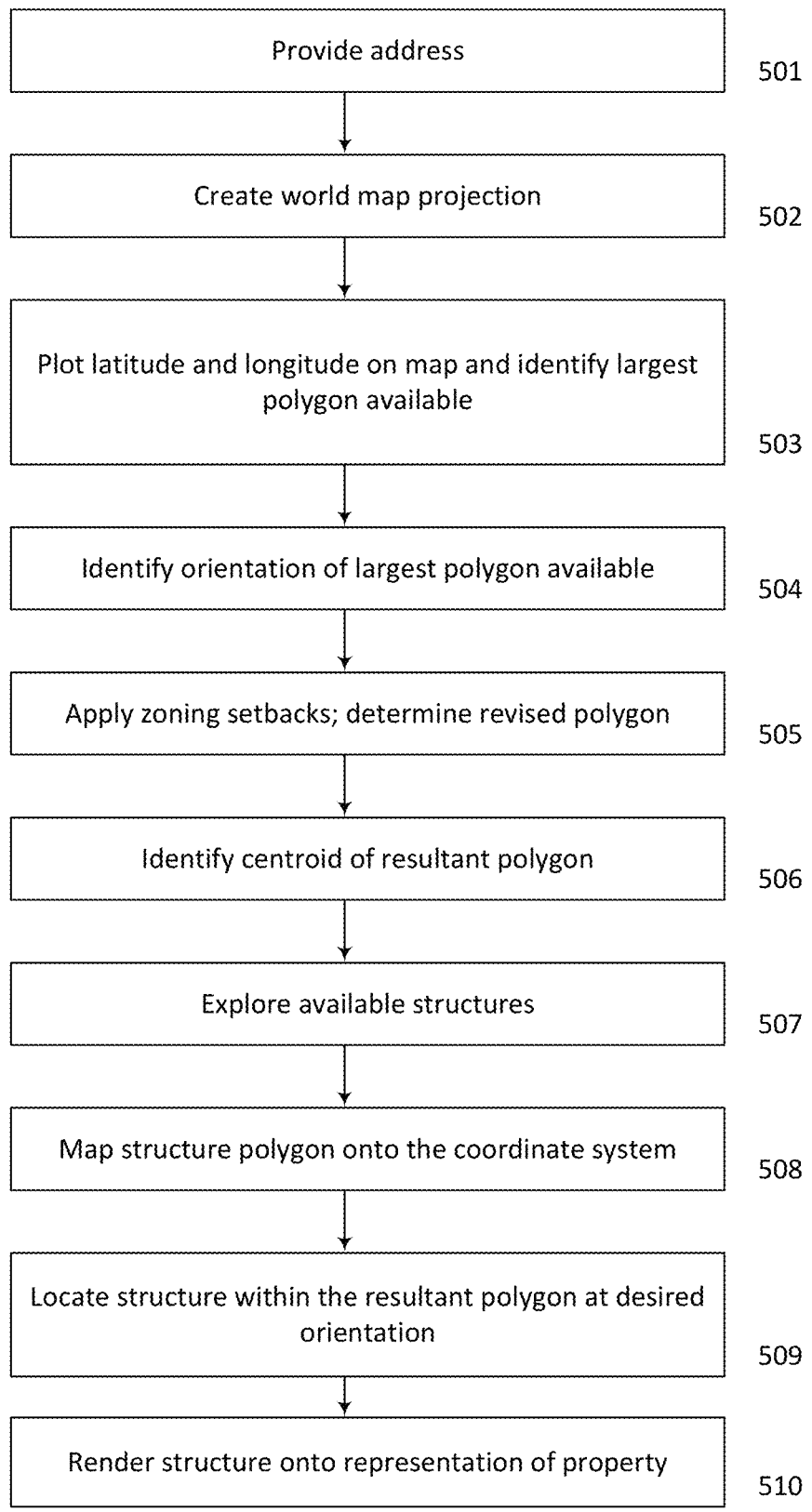
FIG. 5 shows a flowchart in accordance with one embodiment of the present design.

FIG. 5 illustrates a general flowchart of operation according to the present design. Established prior to the operation depicted in FIG. 5 are geographic data layers including property maps and map data, including attributes such as elevation data and potentially property boundaries, as well as a map projection coordinate system, namely a map including relevant areas in a coordinate system, such as a cartesian coordinate system, latitude/longitude, X-Y, or other appropriate coordinate system. This coordinate system is used as a basis for forming the various polygons and property attributes, such as centroids, offsets, and so forth.

From FIG. 5, at point 501 the user or a remote entity or other entity or device may provide an address. Additional information may be provided, such as desired type of structure, desired restrictions or attributes, information as to placement of the structure, and so forth. At point 502, the system creates a world map projection with geo data layers establishing a first property and boundary estimate, and may determine the location of streets or other features. Geo data layers are known APIs, usable with services such as Google Maps, used to mark up a map with different overlays, such as markers, polylines, polygons, and so forth, combining styling information and location data. The data layer may be used to add geographical data to a mapping. If such geographical data contains geometries (e.g. lines or polygons), the API renders these on the map. The designer can provide features in a manner similar to a typical overlay. Property and boundary estimates used in the geo data layer is generally available to the public, provided by local governments and/or certain public databases or web sites. Point 503 calls for plotting the latitude and longitude of the property on a map and identifying a largest polygon available on the property, where the largest polygon available contemplates all buildable property based on records available. Such largest polygon available determination may entail identifying the location in the geo data layers to establish logical and/or available boundaries.

Google Maps, for example, typically does not provide longitude/latitude information for properties or even dimensions. The present system determines these values and provides information and dimensions in the geo data layer for later use by the system. Certain information is provided by services such as Google Maps, and this information can be converted into longitude, latitude, property boundary location, and so forth, and the system may superimpose polygons and lines over existing photos.

Point 504 seeks to assess and possibly modify the largest polygon available by identifying the orientation of the largest polygon available, such as front, sides, or rear of the property. In one embodiment, the system identifies a line representing the street. Street data may be maintained in a street data layer, and property attributes are available in a property data layer, for example. Other relevant data layers may be provided, searched, and relevant data employed. The edges of the modified polygon may be compared to the street line to establish the front of the property. At point 505, the system applies zoning setbacks to the largest polygon available, resulting in a revised polygon that represents the size of the available lot after setbacks. The system may, in one embodiment, translate or de-project the polygon into a Euclidean coordinate system. The system may then rotate the revised polygon to provide a "front" edge, i.e. the perceived front of the property based on street orientation, along the X axis. The system may then transform the polygon's borders according to front and side setback requirements, which may be particular to the jurisdiction and may be available from a remote or local source or may be estimated. The system then re-projects the resultant polygon's coordinates to the map projection coordinate system, essentially merging the resultant polygon and the map.

At point 506, the system identifies the centroid of the resultant polygon. The system may accommodate for odd shaped lots and/or the desire for locating multiple structures on the property when computing a centroid. For example, if the property consists of two similarly sized large areas joined by a smaller area, a pure centroid computation may determine a centroid at a location where a reasonable structure could not be constructed, while location in one of the two larger areas may be acceptable. The system may make such accommodation determinations.

Point 507 calls for the system to explore available structures. In one embodiment, the system may select from a product catalog of structures to identify structures that would fit on the resultant polygon. In another embodiment, the system projects the structure polygon into or onto the map projection coordinate system discussed above, namely the baseline map in a predetermined coordinate system. For example, a point on the northwest corner of the property may be at 34.005760 latitude and −118.972030 longitude, or −157.33693 on the X axis and 203.49822 on the Y axis, or some other coordinate system. Each structure has a polygon, herein called the structure polygon, and point 508 calls for mapping the structure polygon onto this system, typically centered on the centroid of the resultant polygon. In other words, the structure centroid may be initially collocated with the centroid of the resultant polygon. The system may rotate the structure polygon about the centroid of the resultant polygon until all points fit within the resultant polygon, and the system may also translate the structure to fit within the resultant polygon and satisfy the necessary conditions, such as the front of the structure oriented toward the street. If a rotation exists where the all points fall within the resultant polygon and no points fall outside the resultant polygon, the structure is considered a possible structure. Otherwise the user may be advised that the structure cannot be accommodated, or the structure may simply be ignored or discarded with respect to this particular property site.

At point 509, the system may locate the structure on the property within the resultant polygon at a desired orientation. The system typically has the ability to locate the structure graphically on the property, such as by a rendering including at least lines but potentially illustrating walls, windows, and other components of the structure. Point 510 calls for rendering the structure in the desired orientation on the property, within the resultant polygon. The user may, in some embodiments, have an ability to customize the structure with available cladding, colors, roof options, and so forth, selectable by the user. The system uses the specific model with the user selected attributes in the rendering created based on the selected property. Graphical representations of the property are available, including contours, elevations, and potentially features such as trees and so forth. In one embodiment, features may be added, including but not limited to trees, bushes, fencing, pools, and so forth. The structure, or more specifically the visual representation of the structure, is located on the property and a two-dimensional representation rendered, and system may transmit the resultant rendering to the user or a remote computing device.

In a further embodiment, the system provides the property to the user and a footprint of the desired structure and enables the user to translate or rotate the structure to his or her desired orientation. Location of the structure on the property may be provided to the system, and the rendering of the desired structure on the property in the desired orientation transmitted to the user. Such an implementation requires a more advanced user interface, but the information transmitted to the user includes the resultant polygon and at least one structural representation footprint, potentially with centroids for both, as well as an indication of relevant markers or markings, such as street, front of the structure, and so forth.

The system may provide existing structures, in the form of a photograph or other visual rendering of the existing structure on the property, together with an additional structure. In general, a two-dimensional depiction of the structure on the property in question is made available, either in plan view or perspective, such as from a service such as Google Maps. A two-dimensional aerial view may also be provided as desired. In accordance with the present design, the representation provided to the remote user or remote computing device occurs in much less time than previously know, and in most instances in real time or essentially real time, in virtually every situation within less than ten minutes, and at times less than one minute or even less than ten seconds.

Three Dimensional (3D) Graphical Representation

Figure 6:
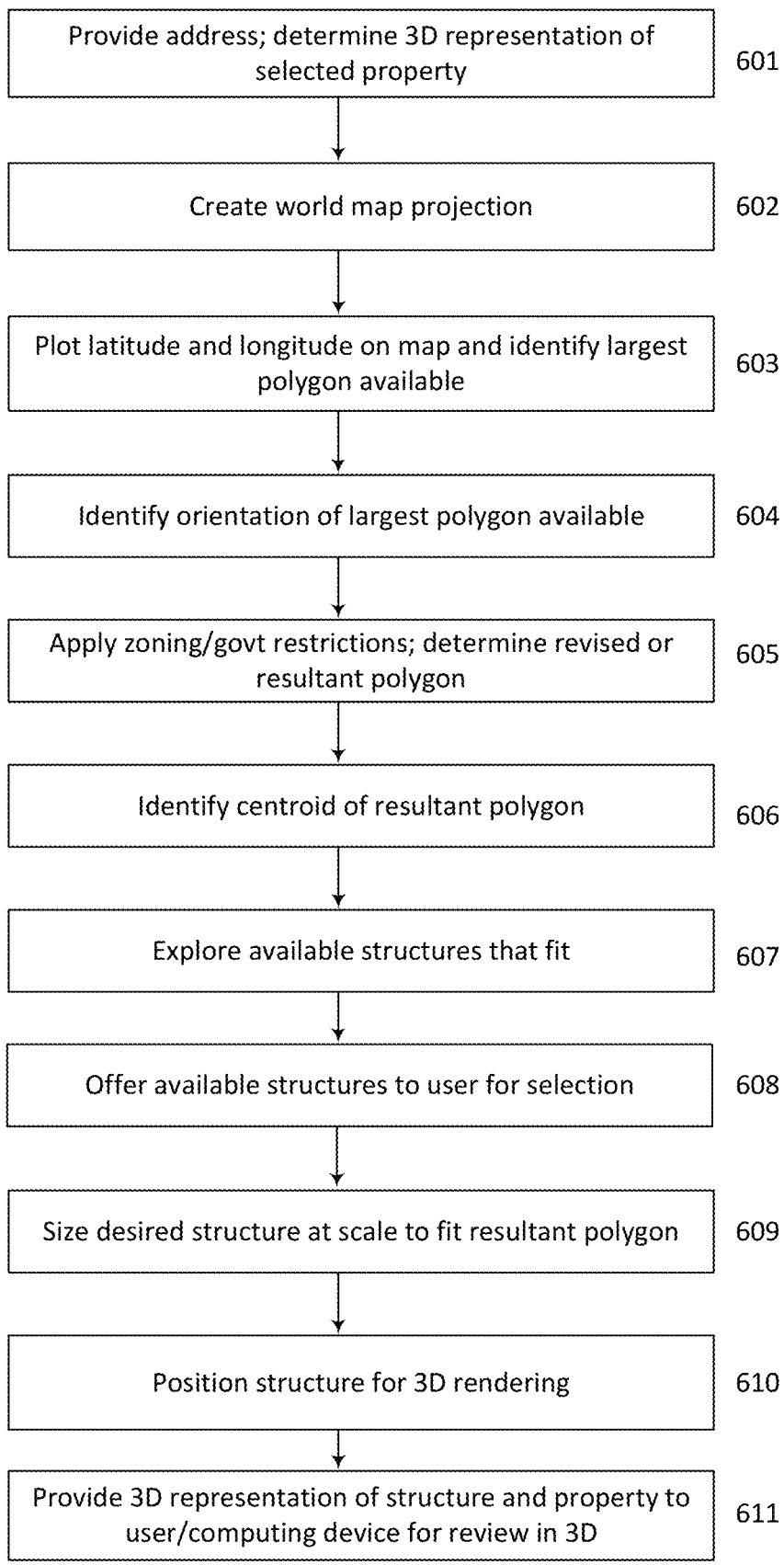
FIG. 6 is a flowchart illustrating a three dimensional embodiment of the present design.

An alternative aspect of the present design comprises assessing the land based on existing records and providing a three-dimensional representation of a structure on the existing plot of land. FIG. 6 shows a general representation of the operation of the current aspect, with overlap of certain functionality with the above mentioned embodiments.

From FIG. 6, an address is provided to the system at point 601. Point 601 also calls for obtaining a three-dimensional visual representation of the property. Such a visual representation may be taken from available photographic representations, three dimensional or two dimensional, and interpolated by the system to include a three-dimensional representation of the property with any and all current structures removed. Significant features may be removed by the system, such as trees, driveways, pools, and so forth. Land features may be altered as desired, such as changing slope contours. A graphical representation may be presented, i.e. a line drawing, of the property in question. The end result is a three dimensional representation of the property in any form without any existing structure thereon.

The system creates a world map projection at point 602, the world map projection including geo data layers establishing a property and boundary estimate based on the address and may determine the location of streets or other features. Such data is generally available from local governments and/or certain public databases or web sites. Point 603 plots the latitude and longitude of the property on a map and identifies a largest polygon available on the property, where the largest polygon available contemplates all buildable property based on records available. Such largest polygon available determination may entail identifying the location in the geo data layers to establish logical and/or available boundaries. Point 604 then identifies an orientation of the largest polygon available on the property, i.e. an edge facing the street. Point 605 calls for applying any governmental restrictions, including but not limited to zoning setbacks to determine a revised or resultant polygon acceptable in the jurisdiction where the property is located. Application of governmental restrictions, such as zoning, can only reduce the size of the polygon, so the resultant polygon may be the same size or smaller than the largest available polygon.

Point 606 identifies a centroid of the resultant polygon, while point 607 explores available structures that would fit on the resultant polygon. The structures are associated with three dimensional renderings thereof. Only certain three-dimensional options may be available based on the builder and available structure options. For example, one structure may be offered in a single-story configuration with or without an additional spare bedroom and half bath, and a total of five, or fifty, possible structures may be offered to the user, from which she may select a desired structure. In essence, a finite number of options may be available for any given lot or polygon and those options, if any, may be presented to the user. Each available structure may have a centroid associated therewith or may be defined by exterior boundaries. Once the available structures that will fit have been determined at point 607, point 608 offers the selections to the user. Once the user determines the selection, the system may seek to locate the centroid of the structure as close as possible to the centroid when one is provided, accounting for restrictions such as front of the structure, street location, and so forth, and the structure may be positioned and repositioned, such as by rotating the structure selected, to fit within the resultant polygon at an acceptable orientation.

The desired structure is sized relative to the three-dimensional property representation to be of scale at point 609. The structure, placed on the three-dimensional representation of the property, is positioned such that it may be rendered visually in three dimensions on the actual property at point 610. Such processing entails taking the visual representation of the property established at point 601 and positioning the desired structure on the selected property in a desired orientation, such as with the structure centroid positioned close to the resultant polygon centroid, or in an orientation that fits on the property. Point 611 provides the three-dimensional representation of the structure and property, with the structure on the property, to the user for review. The user may rotate the structure with an observation point at various orientations, distances, and angles using three-dimensional rendering processing.

The result is an ability for the user to select a property, a structure, and observe the structure from various angles on the actual property selected. Such a structure in this scenario should and likely will adhere to all known government ordinances and requirements. A user can then select a structure he or she prefers knowing what the structure may look like when completed on the property.

The present design may be adapted to employ augmented reality, offering the user an ability to view a 3D rendered structure on the specific property, moving around using a device such as a smartphone, tablet, or other computing device to see how the structure would appear on the property selected. Alternately, the system may display a small version of the structure in virtual space, such as by hologram or other 3D projection method, enabling the user to move around the structure to better understand the design, potentially separate from the property.

The system may offer the ability for users to select certain room configurations, such as a configuration with three full baths rather than 2.5 baths, or with a desired relationship between living area, dining area, and kitchen. Standardized modules may be offered, kitchen module, floor panels, roof panels, and so forth, as an alternate to or in addition to selecting from specific standard homes that fit on specific lots. In this scenario, the system may apply zoning constraints, and the system may present an option the user can use to design a specific home with standard components or modules. In one further embodiment, the system may receive full 3D renderings of locations, such as a neighborhood, and the user may select a structure to be located on the property, and the system may afford views from the inside of the structure or at a position on the property of adjoining structures, i.e. the view out the upstairs window, the view of the neighbor's yard, view of the ocean or river or other natural features, and so forth. Such 3D rendering may require information available about 3D aspects of natural and man made features and 3D renderings from multiple positions and points, similar to that available in certain software applications, such as video games.

Thus according to one embodiment, a system for providing a three dimensional representation of a desired structure on a selected property is presented. The system comprises a processing arrangement configured to receive a property indication of the selected property, at least one converter configured to convert the property indication to a standardized three dimensional visual format representing a three dimensional graphical representation of the selected property, a mapper configured to map the property to a largest available polygon that will fit on the selected property, a zoning setback computation element configured to determine a resultant polygon from the largest available polygon based on local governmental zoning restrictions for the selected property, location hardware configured to enable a user to select the desired structure, the desired structure selectable from one of a plurality of available structures, and orient the desired structure on the resultant polygon at an available and permissible orientation, and a renderer configured to render the desired structure on the selected property in three dimensional graphical form, thereby producing the three dimensional representation.

According to a further embodiment, there is provided a method for providing a three-dimensional representation of a desired structure on a selected property. The method comprises receiving at a computing arrangement a property indication of the selected property transmitted by a remote computing device in a first form, at the computing arrangement, converting the property indication from a first form to a second form and establishing a graphical three dimensional representation of represent, at the computing arrangement, plotting the second form of the property indication on a map and identifying a largest polygon available that fits on the selected property, at the computing arrangement, receiving governmental property restriction information and applying the governmental property restriction information to the largest polygon available to determine a resultant polygon, at the computing arrangement, locating the desired structure in a desired orientation within the resultant polygon, at the computing arrangement, establishing the three dimensional representation of the desired structure on the selected property, and transmitting the three dimensional representation of the desired structure on the selected property from the computing arrangement to the remote computing device.

According to a further embodiment, there is provided a system for providing a three-dimensional representation of a desired structure on a selected property, comprising a transmission element configured to transmit a property indication in a first form, and a central processing arrangement comprising at least one computing device. The computing device is configured to receive an indication from a user of the desired structure, develop a three dimensional representation of the selected property based on available information about the selected property, convert the property indication from a first form to a second form, plot the second form of the property indication on a map and identify a largest polygon available that fits on the selected property, receive governmental property restriction information and apply available governmental property restriction information to the largest polygon available to establish a resultant polygon, locate the desired structure in a desired orientation within the resultant polygon, and determine a three dimensional graphical representation of the desired structure scaled to fit the resultant polygon and graphically located on the three dimensional representation of the selected property. The central processing arrangement is further configured to transmit the three-dimensional graphical representation of the desired structure on the selected property to the transmission element.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another, i.e. may include transitory and/or non-transitory computer readable media. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The foregoing description of specific embodiments reveals the general nature of the disclosure sufficiently that others can, by applying current knowledge, readily modify and/or adapt the system and method for various applications without departing from the general concept. Therefore, such adaptations and modifications are within the meaning and range of equivalents of the disclosed embodiments. The phraseology or terminology employed herein is for the purpose of description and not of limitation.

What is claimed is:

1. A method for providing a three-dimensional representation of a desired structure on a selected property, comprising:
   receiving at a computing arrangement a property indication of the selected property transmitted by a remote computing device in a first form;
   at the computing arrangement, converting the property indication from a first form to a second form and establishing a graphical three-dimensional representation of the selected property;
   at the computing arrangement, plotting the second form of the property indication on a map and identifying a largest polygon available that fits on the selected property, wherein the largest available polygon is limited in size based on boundaries and topographical contour depth differentials in the selected property;
   at the computing arrangement, receiving governmental property restriction information and applying the governmental property restriction information to the largest polygon available to determine a resultant polygon;
   at the computing arrangement, locating the desired structure in a desired orientation within the resultant polygon;
   at the computing arrangement, establishing the graphical three-dimensional representation of the desired structure on the selected property; and
   transmitting the graphical three-dimensional representation of the desired structure on the selected property from the computing arrangement to the remote computing device.

2. The method of claim 1, wherein the first form is a physical street address and the second form is a latitude and longitude corresponding to the physical street address.

3. The method of claim 1, wherein the desired structure is selected from a plurality of available structures.

4. The method of claim 1, wherein locating the desired structure in the desired orientation within the resultant polygon comprises determining a polygon centroid of the resultant polygon and initially collocating the polygon centroid with a structural centroid of the desired structure.

5. The method of claim 1, wherein locating the desired structure in the desired orientation within the resultant polygon comprises positioning a front of the desired structure toward an adjacent street.

6. The method of claim 1, wherein locating the desired structure in the desired orientation within the resultant polygon comprises rotating the desired structure and deeming the desired structure acceptably oriented when rotation of the desired structure in the resultant polygon does not result in portions of the desired structure falling outside the resultant polygon.

7. The method of claim 1, wherein the transmitting occurs within one minute after receiving.

8. A system for providing a three-dimensional representation of a desired structure on a selected property, comprising:
   a processing arrangement configured to receive a property indication of the selected property;
   at least one converter configured to convert the property indication to a standardized three-dimensional visual format representing a three-dimensional graphical representation of the selected property;
   a mapper configured to map the selected property to a largest available polygon that will fit on the selected property, wherein the mapper is configured to limit size of the largest available polygon based on both boundaries and topographical contour depth differentials in the selected property;
   a zoning setback computation element configured to determine a resultant polygon from the largest available polygon based on local governmental zoning restrictions for the selected property;
   location hardware configured to enable a user to select the desired structure, the desired structure selectable from one of a plurality of available structures, and orient the desired structure on the resultant polygon at an available and permissible orientation; and a renderer configured to render the desired structure on the selected property in three-dimensional graphical form, thereby producing the three dimensional representation.

9. The system of claim 8, further comprising a zoning contact element configured to obtain relevant governmental zoning data based on location of the selected property including available zoning setback restrictions.

10. The system of claim 8, wherein the location hardware computes a polygon centroid for the resultant polygon, locates a structure centroid of the desired structure, and seeks to collocate the desired structure centroid and polygon centroid.

11. The system of claim 8, wherein the location hardware positions a front of the desired structure toward an adjacent street.

12. The system of claim 8, wherein the location hardware rotates the desired structure and accepts the desired structure if rotation of the desired structure in the resultant polygon does not result in portions of the desired structure falling outside the resultant polygon.

13. The system of claim 8, further comprising a transmission element configured to transmit the three-dimensional representation is to a remote computing device.

14. The system of claim 13, wherein the user can rotate the desired structure on the three-dimensional graphical representation of the selected property.

15. A system for providing a three-dimensional representation of a desired structure on a selected property, comprising:
    a transmission element configured to transmit a property indication in a first form; and
    a central processing arrangement comprising at least one computing device, the computing device configured to:
        receive an indication from a user of the desired structure;
        develop a three-dimensional representation of the selected property based on available information about the selected property;
        convert the property indication from a first form to a second form;
        plot the second form of the property indication on a map and identify a largest polygon available that fits on the selected property, wherein the largest polygon available is limited in size based on boundaries and topographical contour depth differences in the selected property;
        receive governmental property restriction information and apply available governmental property restriction information to the largest polygon available to establish a resultant polygon;
        locate the desired structure in a desired orientation within the resultant polygon; and
        determine a three-dimensional graphical representation of the desired structure scaled to fit the resultant polygon and graphically located on the three dimensional representation of the selected property;
    wherein the central processing arrangement is further configured to transmit the three-dimensional graphical representation of the desired structure on the selected property to the transmission element.

16. The system of claim 15, wherein the first form is a physical street address and the second form is a latitude and longitude corresponding to the physical street address.

17. The system of claim 15, wherein the user selects the desired structure from a fixed plurality of available structures.

18. The system of claim 15, wherein locating the desired structure in the desired orientation within the resultant polygon comprises determining a polygon centroid of the resultant polygon and initially collocating the polygon centroid with a structural centroid of the structure.

19. The system of claim 15, wherein locating the structure in the desired orientation within the resultant polygon comprises positioning a front of the desired structure toward an adjacent street.

20. The system of claim 15, wherein locating the desired structure in the desired orientation within the resultant polygon comprises rotating the desired structure and deeming the desired structure acceptable when rotation of the desired structure in the resultant polygon results in no portions of the desired structure falling outside the resultant polygon.

* * * * *